United States Patent [19]

Rothfuss

[11] 4,092,651
[45] May 30, 1978

[54] DEVICE AND METHOD FOR EXPOSING PHOSPHOR DOTS IN A COLOR TELEVISION PICTURE TUBE

[75] Inventor: Hans Rothfuss, Stuttgart, Germany

[73] Assignee: International Standard Electric Corporation, New York, N.Y.

[21] Appl. No.: 715,344

[22] Filed: Aug. 17, 1976

[30] Foreign Application Priority Data

Aug. 27, 1975 Germany .............................. 2538087

[51] Int. Cl.² .......................... G03B 41/00; G03C 5/00
[52] U.S. Cl. ........................................ 354/1; 96/36.1
[58] Field of Search ................... 354/1; 313/402, 405, 313/470, 472; 96/36.1

[56] References Cited

U.S. PATENT DOCUMENTS

| | | | |
|---|---|---|---|
| 3,476,025 | 11/1969 | Herzfeld et al. | 354/1 |
| 3,639,799 | 2/1972 | Kirchner | 313/402 |
| 3,810,196 | 5/1974 | Barten | 354/1 |

*Primary Examiner*—John Gonzales
*Attorney, Agent, or Firm*—John T. O'Halloran; Thomas M. Marshall

[57] ABSTRACT

A device and method is disclosed for achieving true color picture display during the warm-up phase as well as during the operating phase of a color television picture tube. The device is a screen-coating lens which has been corrected so as to assure that the light source, when exposing the phosphor materials, will correspond to the point of maximum arching of the shadow mask. The method involves exposing the phosphor dots through a corrected lens which takes into account the maximum arching of the shadow mask during the warm-up phase of a color television.

4 Claims, 3 Drawing Figures

DEVICE AND METHOD FOR EXPOSING PHOSPHOR DOTS IN A COLOR TELEVISION PICTURE TUBE

BACKGROUND OF THE INVENTION

1. Field of the Invention

Methods and apparatus for producing color television tubes.

2. Prior Art

The present invention relates to devices for exposing the photo-sensitive layer in the photo-chemical manufacturing process for forming the phosphor triple dot raster on the layer of fluorescent material on the tube envelope's faceplate of the screen of a color television picture tube. As is customary, the layer of fluorescent material consists of a mosaic of different kinds of phosphors, emitting as a rule red, green and blue light which are deposited in successive steps on the inside of the tube's envelope, with the respective deposited photo-sensitive layers, by means of at least one optical screen-coating lens whose optically effective surface has a shape so as to simulate a path of the respective electron beam, which are exposed to light at exactly defined points with the aid of a color selecting electrode consisting of a shadow mask and the mask frame.

In prior publications, for example German Published patent application Nos. 1,927,966 and 1,902,538, it is known that, during the operation of color television picture tube the color selecting electrode is heated considerably, owing to its limited transparency, by the electron beams, about 85% of which are trapped or absorbed by the shadow mask sheet, causing it to expand. As a consequence, the position of the mask aperture is not constant in relation to the position of the trios of color phosphor dots associated with the mask apertures on the screen coated with fluorescent material. Thus the electron beams will no longer land exactly on the phosphor triples. This produces a deteriorating effect upon the displayed color picture.

It has been recognized that the color-selecting electrode must be moved in the direction of the longitudinal axis of the color television picture tube toward the screen coated with fluorescent material (phosphor) in order to hit the phosphor triples exactly. In accordance with the teachings of the above referenced German publications this is accomplished by utilizing suspension elements consisting substantially of bimetal springs which, upon being heated, are deformed to such an extent as to shift the color-selecting electrode in the desired way toward the coating of fluorescent material. Accordingly, these conventional suspension elements shift the color selecting electrode in such a way that the effect of their expansion is compensated in the final state.

Meanwhile, however, investigations have proven that during the warm-up phase of the color television picture tube the thin shadow mask, due to its relatively limited transparency, is very rapidly heated up by the impinging electron beams, while on the other hand the mask frame, because of its larger mass, is not heated up as quickly as the shadow mask and takes more time before it reaches its operating temperature. During this time the shadow mask is arched because of the expansion created by the shadow mask being heated up and it is not compensated for by a corresponding expansion of the mask frame. Accordingly, the landing points of the electron beams on the coat of fluorescent material are displaced and the phosphor triples are not hit by the electron beams as exactly as they should be. In order to obtain a true color display in the warm-up operating state the shadow mask must be moved away from the coat of fluorescent material in the direction of the longitudinal axis of the color television picture tube.

The necessary and previously described movement of the color-selecting electrode toward the coat of fluorescent material should not take place until after both the shadow mask and the mask frame have reached almost the same temperature.

According in my prior German patent application No. P 23,59,844.9, I have already proposed to use suspension elements which cause the color selecting electrode to be first of all moved away from the coat of fluorescent material when the color television picture tube is put into operation and only thereafter towards the coat of fluorescent material. These suspension elements consist of two bimetal elements, each of which is composed of two oblong metal strips firmly connected to one another along their narrow longitudinal sides, which have different heat expansion coefficients. The one bimetal element is attached with its one end to the mask frame by spot welding and its other free end the second bimetal is overlappingly attached by a spot weld or a welded seam. At the other end of the second bimetal element an eyelet or opening is provided for attaching the suspension element to the rim extending around the envelope. Both bimetal elements are attached to one another in such a way that each time the metal strip of the one bimetal element having the smaller heat expansion coefficient is connected to the metal strip of the other bimetal element having the larger heat expansion coefficient.

SUMMARY OF THE INVENTION

It is the object of this invention to provide another means and method by means of which it is possible to achieve a true color picture display during the warm-up phase of the color television picture tube without special steps or measures being required in designing the suspension elements.

In accordance with the teachings of this invention this object is achieved by correcting the shape of the optically effective surface of the screen coating lens in such a way that the phosphor triples are exactly exposed and shaped through the shadow mask, which is at room temperature, on those points on the coat of fluorescent material which are hit by the electron beams during the operation of the color television picture tube at the point of maximum arching of the shadow mask.

DESCRIPTION OF THE PREFERRED EMBODIMENT

Figure 1:
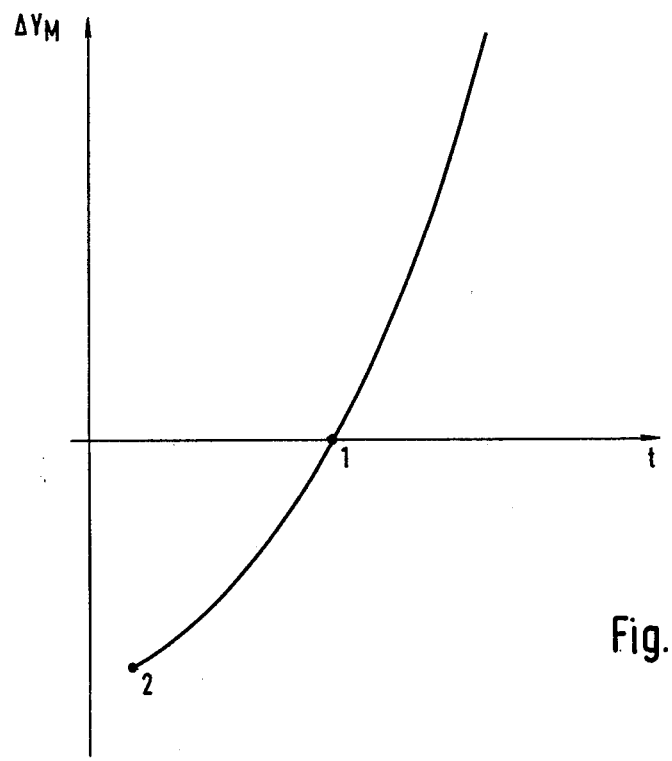
FIG. 1 is a graph illustrating qualitatively and as ascertained by calculation, the movement, $\Delta y_m$ as a function of the operating time $t$, which the color selecting electrode must perform in the direction of the longitudinal axis of the color television tube.

FIG. 1 shows both qualitatively, and as ascertained by calculation, the movement, $\Delta y_m$, as a function of operating time $t$, which the color-selecting electrode must perform in the direction of the longitudinal axis of the color television picture tube in order to assure that the phosphor triples on the coated fluorescent material on the inside of the envelope are hit at any time during the operation of the tube precisely by electron beams passing through apertures in the shadow mask. $+\Delta y_m$ is intended to indicate that the color selecting electrode is moved toward the coat of fluorescent material and $-\Delta y_m$ is construed to mean that the color selecting electrode is moved away from the coat of fluorescent material. $\Delta y_m = 0$, the point designated by the reference numeral 1, indicates the state in which both the shadow mask and the mask frame are at room temperature. In this state the phosphor triples are deposited in the hitherto conventional way on the inside of the envelope of the tube's screen.

The point designated by reference numeral 2 indicates the operating state of the television tube wherein there is the greatest arching of the shadow mask, in other words shortly after the color television picture tube is put into operation when the shadow mask is already warmed up but the mask frame is still relatively cold. If it were possible at this state of arching of the shadow mask to deposit the phosphor triples onto the inside of the envelope of the screen it would only be necessary during operation to shift the color selecting electrode toward the coat of fluorescent material because, from this time position onwards, due to the frame expansion, the extreme arching of the shadow mask is relieved and the mask apertures move outwardly in proportion to the distance from the center point of the shadow mask.

Figure 2:
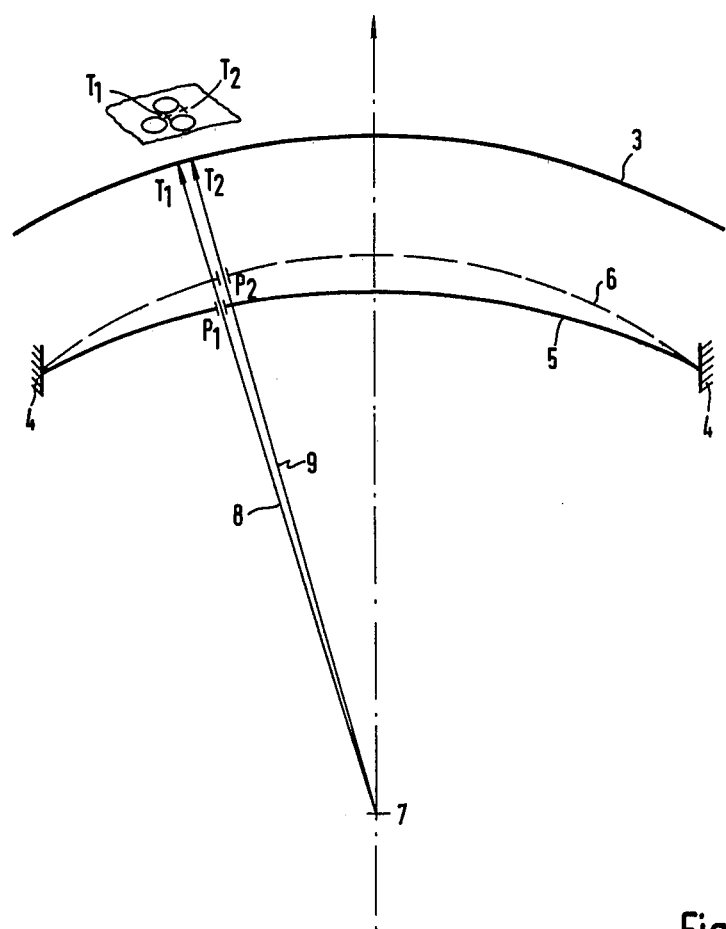
FIG. 2 schematically shows the envelope of a television screen, the cost of fluorescent material thereon, the mask frame, the shadow mask and the path of the central axes of the three electron beams for red, green and blue colors.

FIG. 2 illustrates schematically the envelope of the screen 3 with the coat of fluorescent material, the mask frame 4 as well as the shadow mask in its room temperature state, designated 5, and in the state of maximum arching of the shadow mask, indicated by the dotted line 6. In the following description it will now be considered that the central axes 8, 9 of the electron beams extend from the center point of deflection 7. The central axes 8 passes through the shadow mask 5 (at room temperature) through mask aperture the $P_1$ and hits the coat of fluorescent material at $T_1$. When the shadow mask 6 is in its state of maximum arching the position of the mask aperture is moved, as illustrated at point $P_2$, so that now the central axis 9 will hit the coat of fluorescent material at the point designated $T_2$.

It is possible to calculate the excursion of the central axis of the three electron beams from $T_1$ towards $T_2$ with respect to each point on the coat of fluorescent material.

Figure 3:
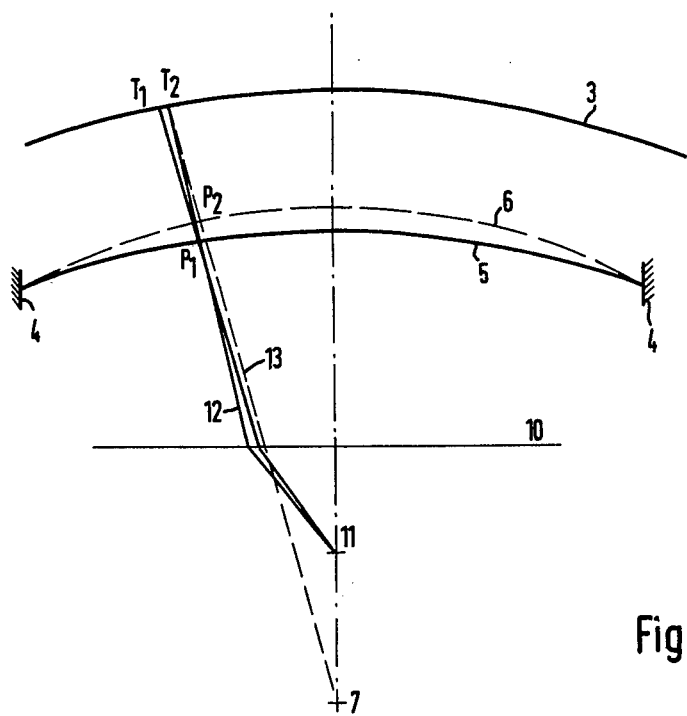
FIG. 3 is a schematic illustration of the means and method of this invention.

These calculated distances are now taken into consideration in the method of exposure with the aid of which the phosphor triples are deposited on the inside of the envelope 3 of the screen. In practice, it is difficult to achieve the arching of the shadow mask when manufacturing the fluorescent screen. Accordingly as illustrated in FIG. 3 a screen coating lens 10 is utilized which has an effective surface curvature which is corrected in such a way with the aid of the calculated distances between $T_1$ and $T_2$ so that the light rays 12 extending from the source of light 11 will pass through the shadow mask 5 which is at room temperature, in other words, through the mask aperature at $P_1$ for hitting the coat of fluorescent material at point $T_2$ so that at this point there will appear a light dot. During the operation of the television picture tube, the electron beam 13 will hit the fluorescent material at this point after having passed through the arched shadow mask 6 at point $P_2$.

In order to maximize the use of the devices currently utilized in production with as little change as possible, the light rays may also be corrected with an additional screen-coating lens in the course of performing the method of exposure. This has the advantage that the previously employed screen coating lens may be continued to be used in the future.

While the method and device of this invention have been described in connection with a specific embodiment, it will be appreciated by those skilled in the art that changes can be made which do not depart from the scope of the appended claims.

What is claimed is:

1. A device for exposing the photo-sensitive layer in the photo-chemical manufacturing process for creating the phosphor triple raster on the layer of fluorescent material on the faceplate of the screen of the television color picture tube, having a shadow mask and mask frame which allows for arching of said shadow mask from a minimum position to a maximum position during the warm-up phase of the operation of said tube, which layer consists of fluorescent material of a mosaic of different kinds of phosphors for emitting preferably red, green and blue light deposited in successive steps on the inside of said envelope with the respective deposited photo-sensitive layer utilizing at least one optical screen coating lens whose optically effective surface includes a shape so that it simulates the path of the respective electron beam being exposed to light at exactly defined points with the aid of a color-selecting electrode consisting of the shadow mask and the mask frame, wherein the shape of the optically effective surface of said screen coating lens is corrected in such a way that the phosphor triples, through the shadow mask at room temperature, are exactly exposed and shaped at those points on the coat of fluorescent material which are hit by the electron beams during the operation of the color television picture tube at the state of maximum arching of said shadow mask.

2. The device in accordance with claim 1 wherein said at least one optical screen coating lens is utilized in the exposure correction of the beam path and an additional conventional screen coating lens is also positioned in said beam path.

3. A method for exposing the photo-sensitive layer during photo-chemical manufacture of the phosphor triple dot raster on the layer of fluorescent material on the faceplate of the screen of a color television picture tube having a shadow mask and mask frame which allows for arching of said shadow mask from a minimum position to a maximum position during the warm-up phase of the operation of said tube including the steps of: depositing said layer of fluorescent material consisting of a mosaic of three different kinds of phosphor which emit preferably red, green and blue light in successive steps onto the inside of said envelope along with a photo-sensitive layer for each, disposing at least one optical screen-coating lens between the source of light utilized to expose said phosphor triple dots between the source of said light and a shadow mask, said optical screen coating lens having the shape of its optically effective surface corrected so that when said phosphor triples are exposed through said shadow mask at room temperature the phosphor triples are exactly exposed and shaped at those points on the coat of fluorescent material which are hit by electron beams during the operation of the color television picture tube when said shadow mask is at its state of maximum arching.

4. The method of claim 3 including the additional step of disposing an additional screen coating lens between said light source and said photo-sensitive layer during the exposure thereof.

* * * * *